(12) United States Patent
Sugizaki et al.

(10) Patent No.: US 9,620,669 B2
(45) Date of Patent: Apr. 11, 2017

(54) SEMICONDUCTOR LIGHT EMITTING DEVICE AND METHOD FOR MANUFACTURING SAME

(71) Applicant: Kabushiki Kaisha Toshiba, Minato-ku, Tokyo (JP)

(72) Inventors: Yoshiaki Sugizaki, Kanagawa-ken (JP); Hideki Shibata, Kanagawa-ken (JP); Akihiro Kojima, Kanagawa-ken (JP); Masayuki Ishikawa, Kanagawa-ken (JP); Hideo Tamura, Kanagawa-ken (JP); Tetsuro Komatsu, Fukuoka-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/505,216

(22) Filed: Oct. 2, 2014

(65) Prior Publication Data
US 2015/0017750 A1    Jan. 15, 2015

Related U.S. Application Data

(63) Continuation of application No. 12/886,709, filed on Sep. 21, 2010, now Pat. No. 8,884,327.

(30) Foreign Application Priority Data

Jun. 3, 2010    (JP) .................................. 2010-127967

(51) Int. Cl.
*H01L 33/48* (2010.01)
*H01L 33/00* (2010.01)
(Continued)

(52) U.S. Cl.
CPC .......... *H01L 33/0066* (2013.01); *H01L 27/15* (2013.01); *H01L 33/0075* (2013.01);
(Continued)

(58) Field of Classification Search
CPC ............. H01L 33/0048; H01L 33/0066; H01L 33/0079; H01L 33/0075; H01L 27/15;
(Continued)

(56) References Cited

U.S. PATENT DOCUMENTS

| 2003/0141506 A1* | 7/2003 | Sano ...................... B82Y 20/00 257/78 |
| 2005/0077531 A1* | 4/2005 | Kim ...................... H01L 33/505 257/98 |

(Continued)

FOREIGN PATENT DOCUMENTS

| EP | 1643566 A1 | 4/2006 |
| JP | 2000-244012 A | 9/2000 |

(Continued)

OTHER PUBLICATIONS

Japanese Office Action issed on Jul. 9, 2013 in the counterpart Japanese patent application No. 2010-127967, an English translation thereof.
(Continued)

*Primary Examiner* — Jarrett Stark
(74) *Attorney, Agent, or Firm* — White & Case LLP

(57) ABSTRACT

According to one embodiment, a semiconductor light emitting device includes a light emitting chip and a fluorescent material layer. The light emitting chip includes a semiconductor layer, a first electrode, a second electrode, an insulating layer, a first interconnect layer, a second interconnect layer, a first metal pillar, a second metal pillar, and a resin layer. The semiconductor layer includes a light emitting layer, a first major surface, and a second major surface formed on a side opposite to the first major surface. The fluorescent material layer is provided on the first major surface and has a larger planer size than the light emitting chip.

10 Claims, 16 Drawing Sheets

(51) Int. Cl.
*H01L 33/38* (2010.01)
*H01L 33/44* (2010.01)
*H01L 33/50* (2010.01)
*H01L 27/15* (2006.01)
*H01L 33/62* (2010.01)

(52) U.S. Cl.
CPC .......... *H01L 33/0079* (2013.01); *H01L 33/38* (2013.01); *H01L 33/44* (2013.01); *H01L 33/48* (2013.01); *H01L 33/50* (2013.01); *H01L 33/486* (2013.01); *H01L 33/62* (2013.01); *H01L 2924/0002* (2013.01); *H01L 2933/005* (2013.01); *H01L 2933/0041* (2013.01); *H01L 2933/0066* (2013.01)

(58) Field of Classification Search
CPC ......... H01L 33/44; H01L 33/50; H01L 33/38; H01L 33/62; H01L 33/486
IPC ................................. H01L 2924/0002,2924/00
See application file for complete search history.

(56) References Cited

U.S. PATENT DOCUMENTS

| | | |
|---|---|---|
| 2005/0194605 A1 | 9/2005 | Shelton et al. |
| 2006/0118510 A1 | 6/2006 | Fujii |
| 2008/0150416 A1 | 6/2008 | Maruyama et al. |
| 2008/0173884 A1 | 7/2008 | Chitnis et al. |
| 2009/0179207 A1 | 7/2009 | Chitnis et al. |
| 2009/0309119 A1* | 12/2009 | Shinohara ............... H01L 33/38 257/99 |
| 2010/0051995 A1* | 3/2010 | Katsuno .................. H01L 33/44 257/98 |
| 2010/0078670 A1* | 4/2010 | Kim ........................ H01L 33/46 257/98 |
| 2010/0127290 A1* | 5/2010 | Joo ......................... H01L 33/62 257/98 |
| 2010/0140640 A1* | 6/2010 | Shimokawa ........ H01L 33/0079 257/98 |
| 2010/0148198 A1 | 6/2010 | Sugizaki et al. |
| 2010/0176410 A1* | 7/2010 | Furuyama ............... H01L 33/46 257/98 |
| 2010/0190280 A1* | 7/2010 | Horiuchi ............. H01L 21/6836 438/28 |
| 2010/0213487 A1* | 8/2010 | Kuo ....................... H01L 21/561 257/98 |
| 2010/0230711 A1* | 9/2010 | Kuo .................... H01L 33/0079 257/99 |
| 2010/0320488 A1* | 12/2010 | Horie ..................... H01L 27/153 257/91 |
| 2010/0320588 A1* | 12/2010 | Dahilig ................. H01L 21/561 257/690 |
| 2011/0073889 A1* | 3/2011 | Sugizaki ............. H01L 33/0095 257/98 |
| 2012/0112215 A1* | 5/2012 | Chai .................... H01L 25/0753 257/89 |

FOREIGN PATENT DOCUMENTS

| | | |
|---|---|---|
| JP | 2002-118293 A | 4/2002 |
| WO | 2007/126093 A1 | 11/2007 |
| WO | 2008/091319 A2 | 7/2008 |
| WO | 2008/091319 A3 | 7/2008 |
| WO | 2009/064330 A2 | 5/2009 |
| WO | 2009/064330 A3 | 5/2009 |

OTHER PUBLICATIONS

Japanese Office Action issued on May 2, 2013 in counterpart Japanese patent application No. 2010-127967, an English translation thereof.

Extended European Search Report for Application No. 10186829.7-2222 issued Jun. 20, 2011.

* cited by examiner

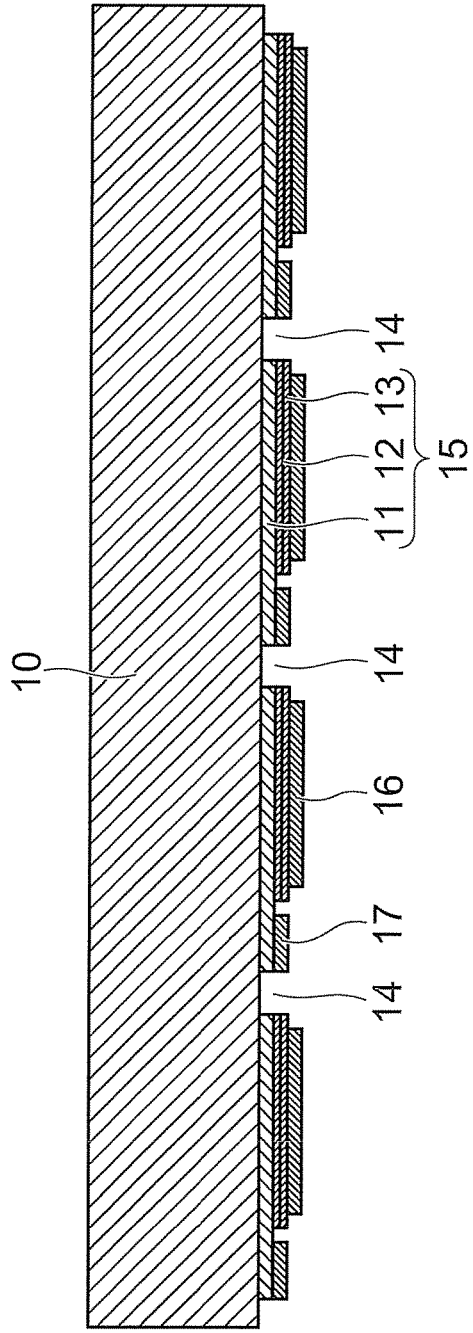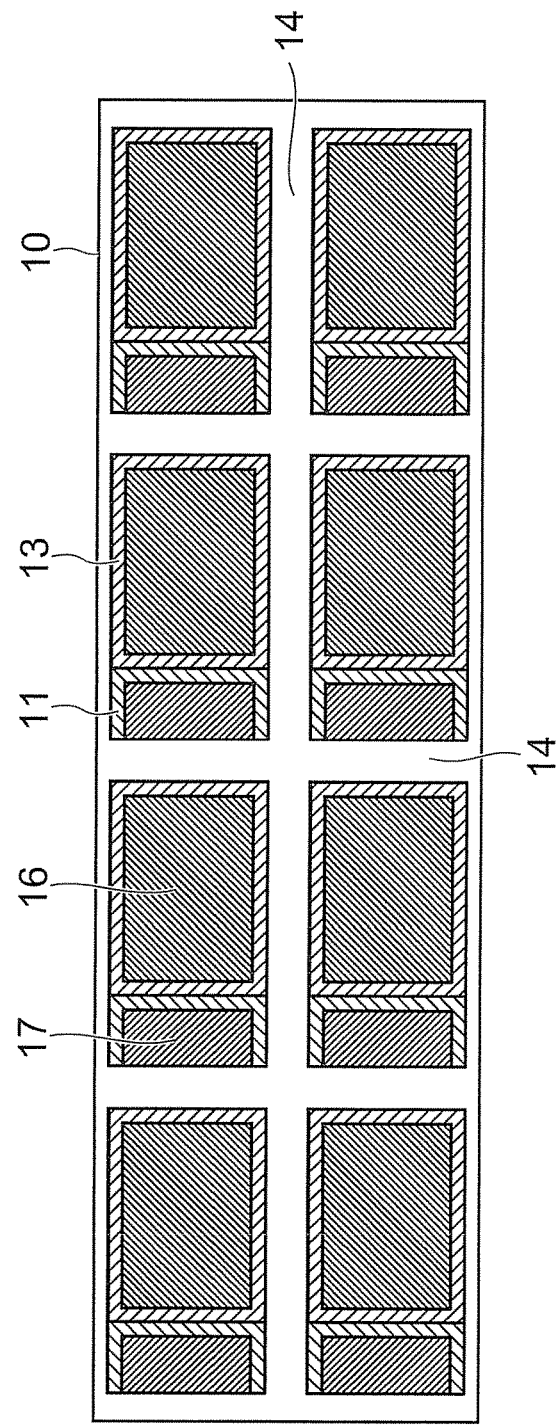

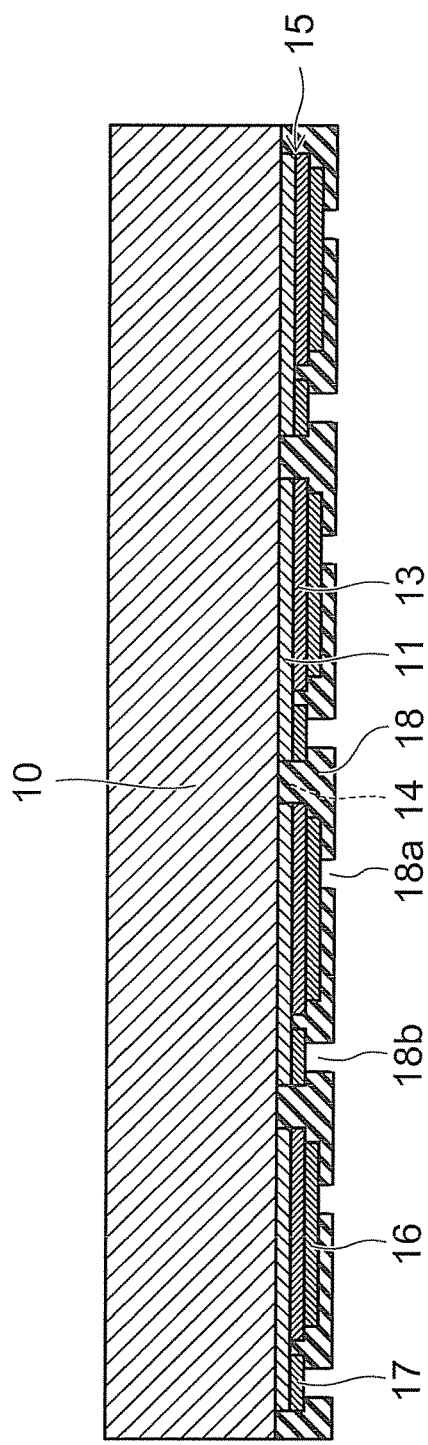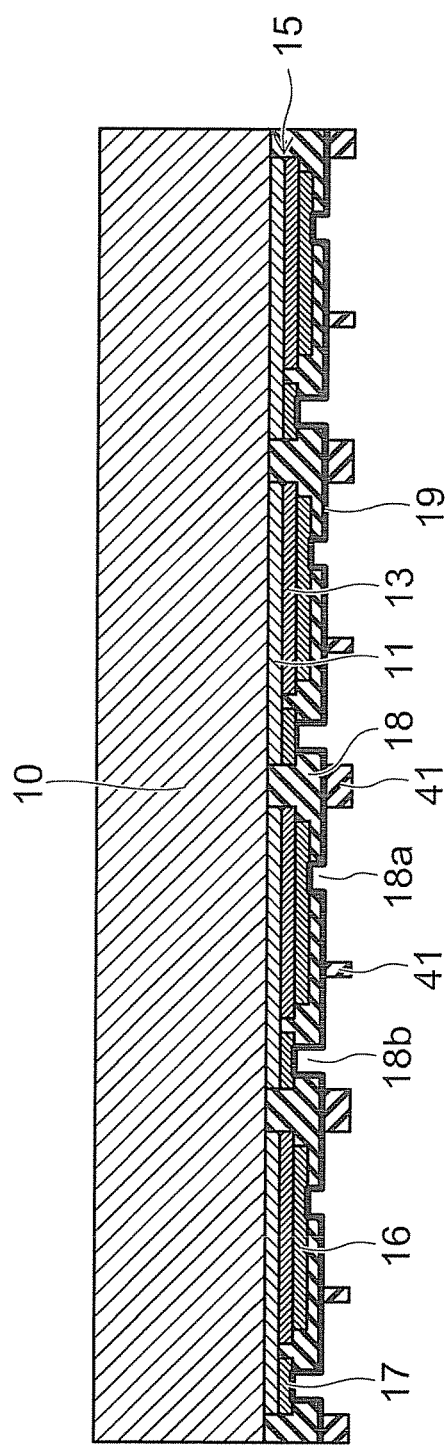
FIG. 3A
FIG. 3B

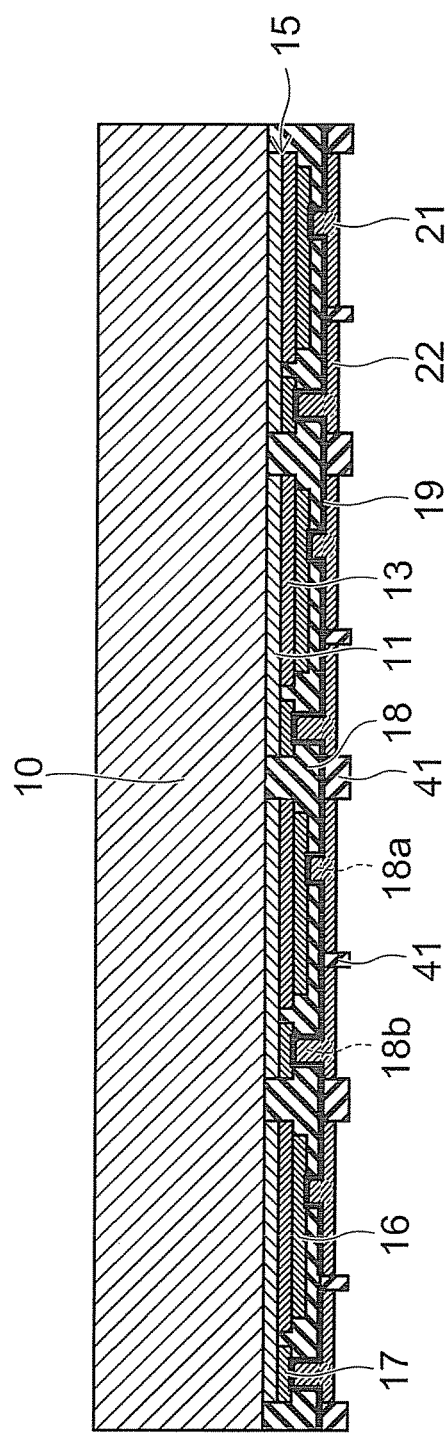
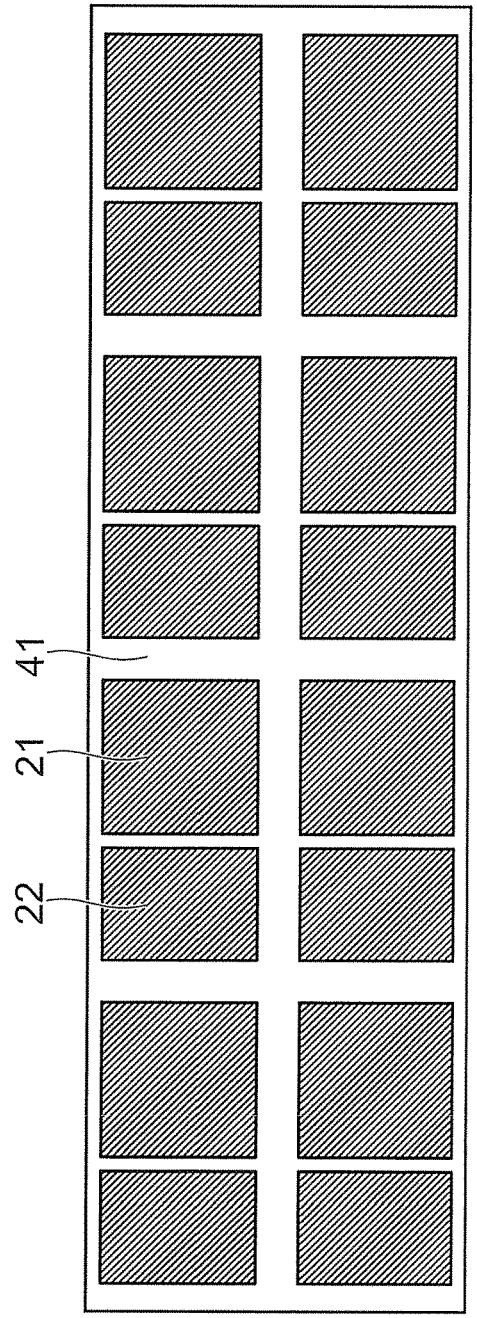
FIG. 4A
FIG. 4B

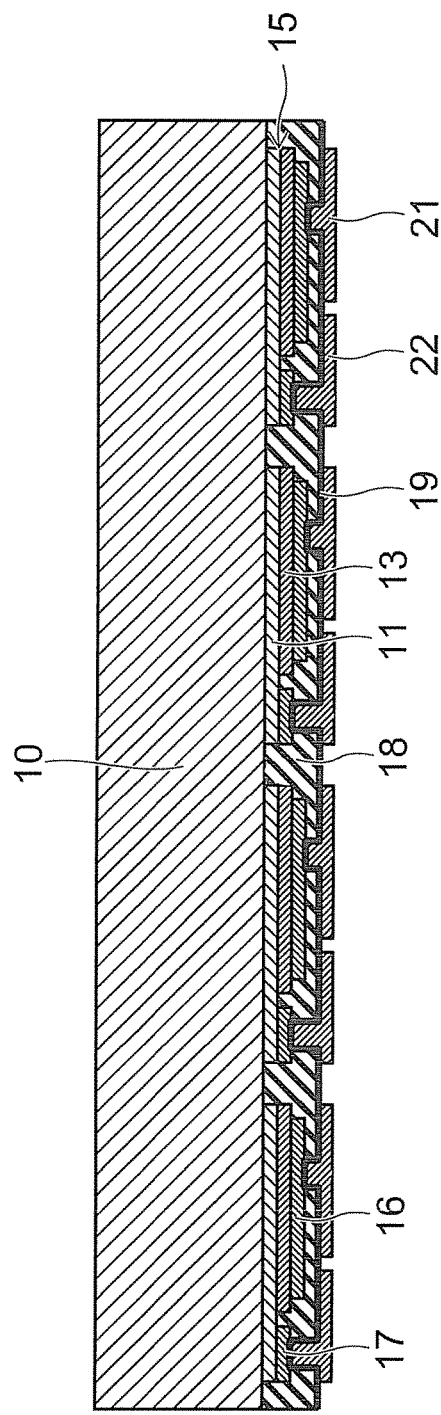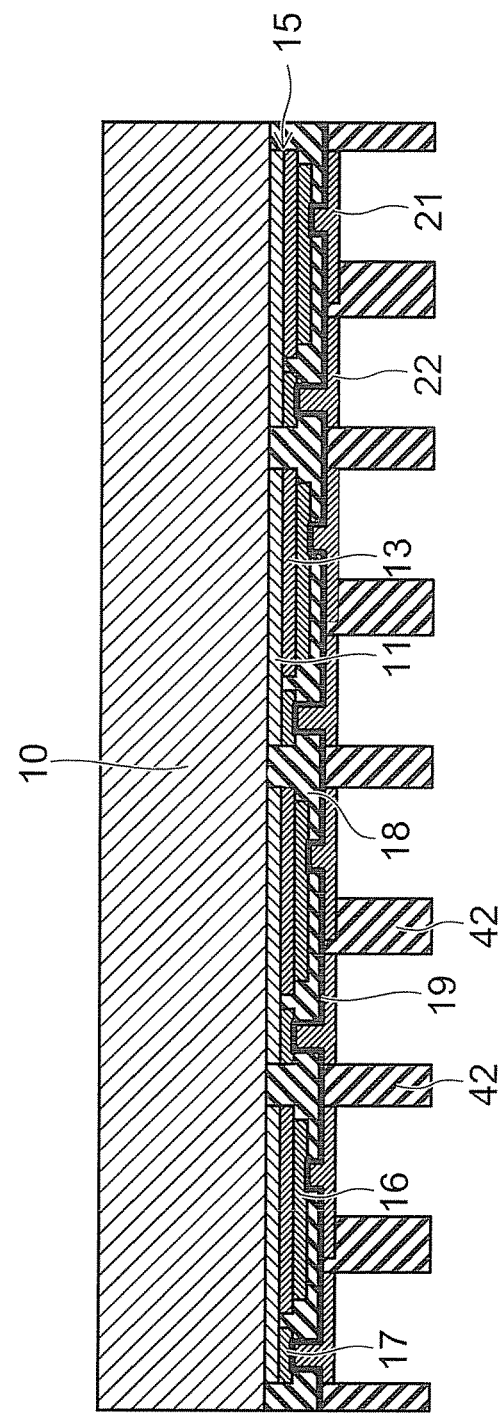
FIG. 5A
FIG. 5B

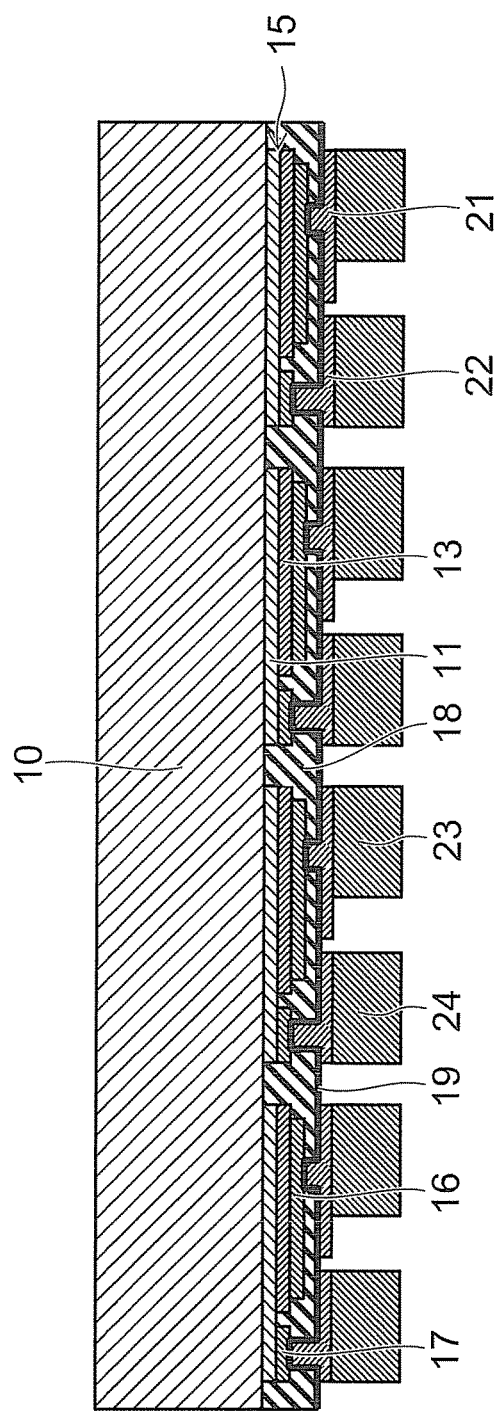
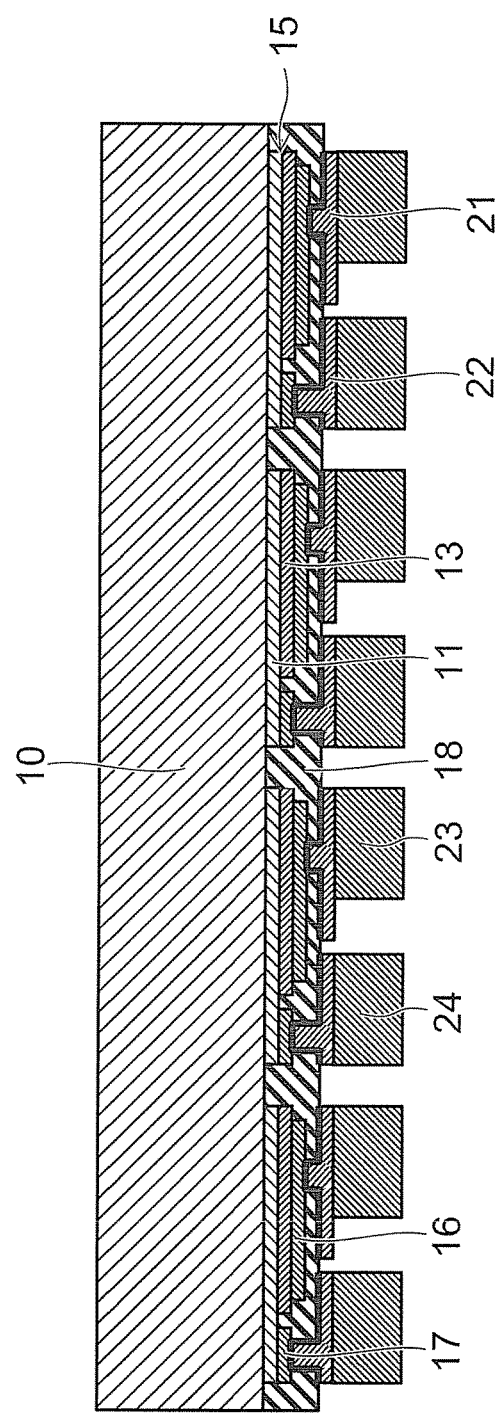
FIG. 7A
FIG. 7B

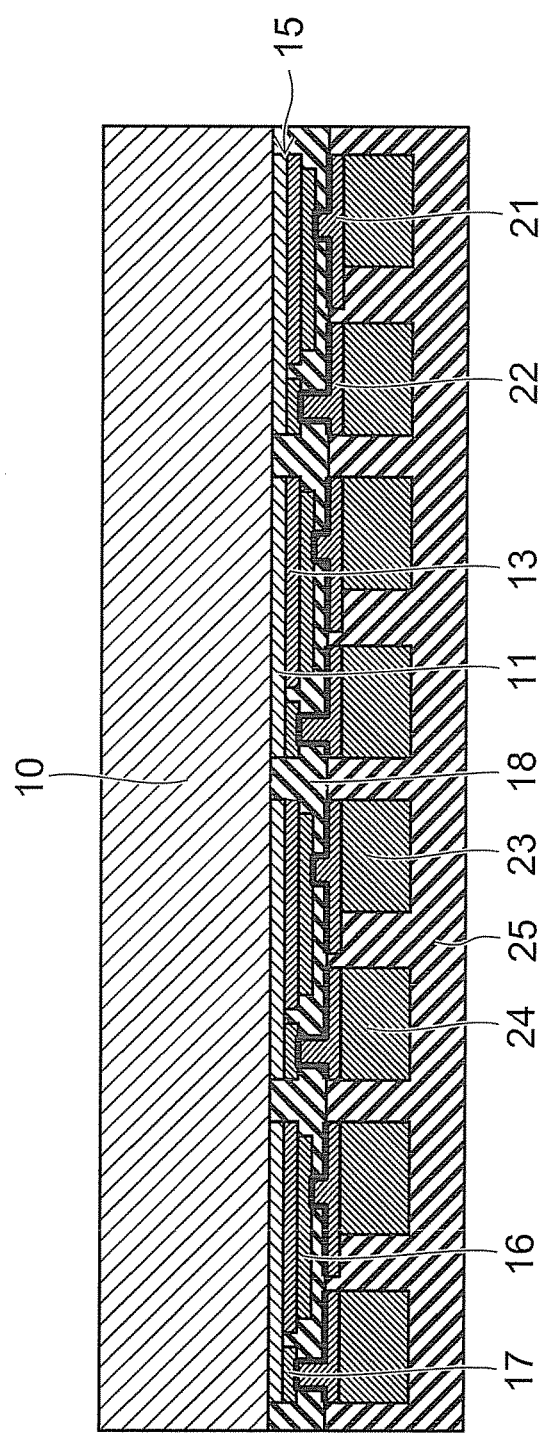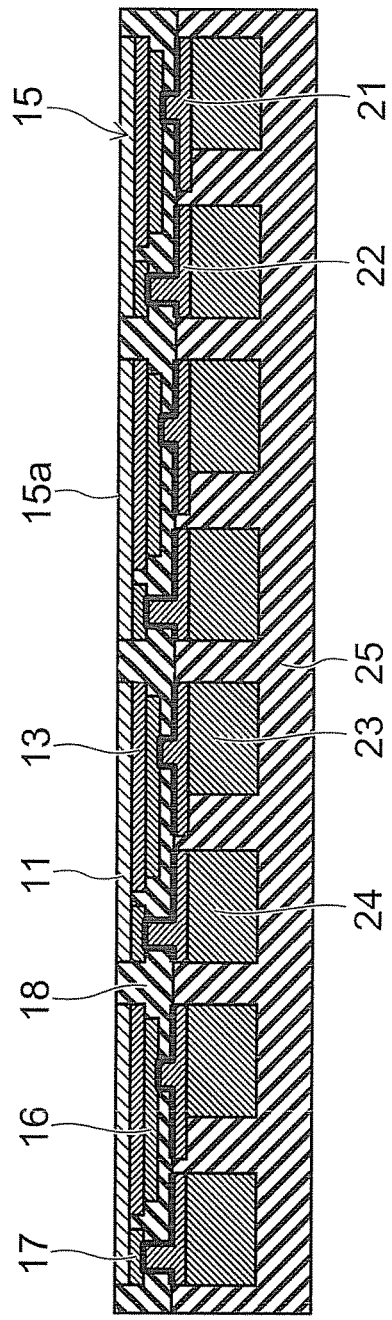

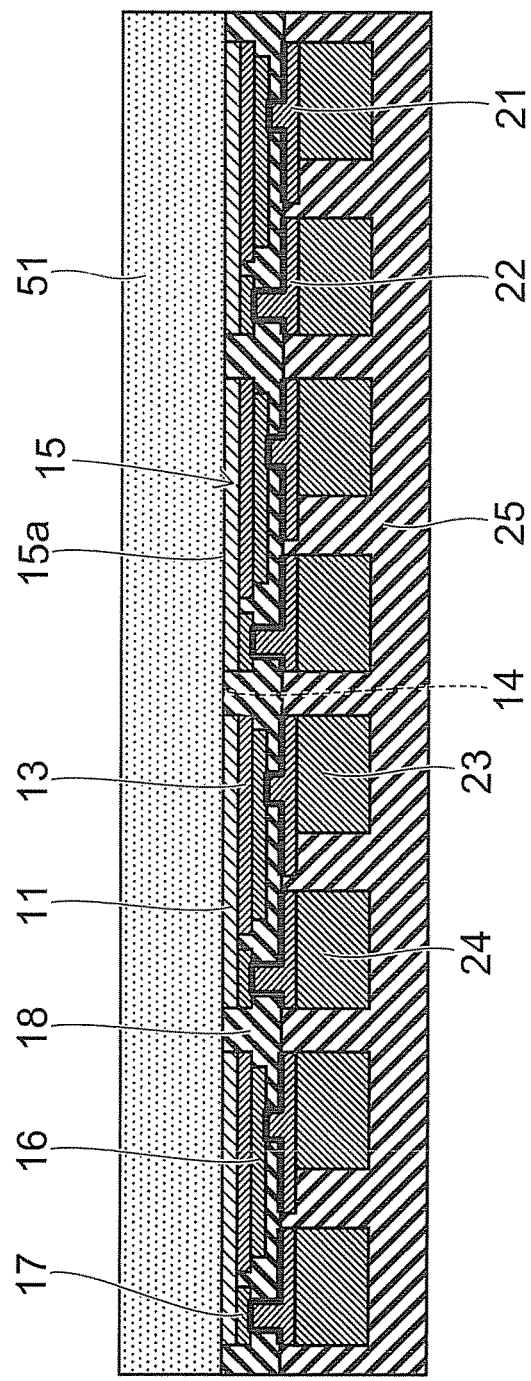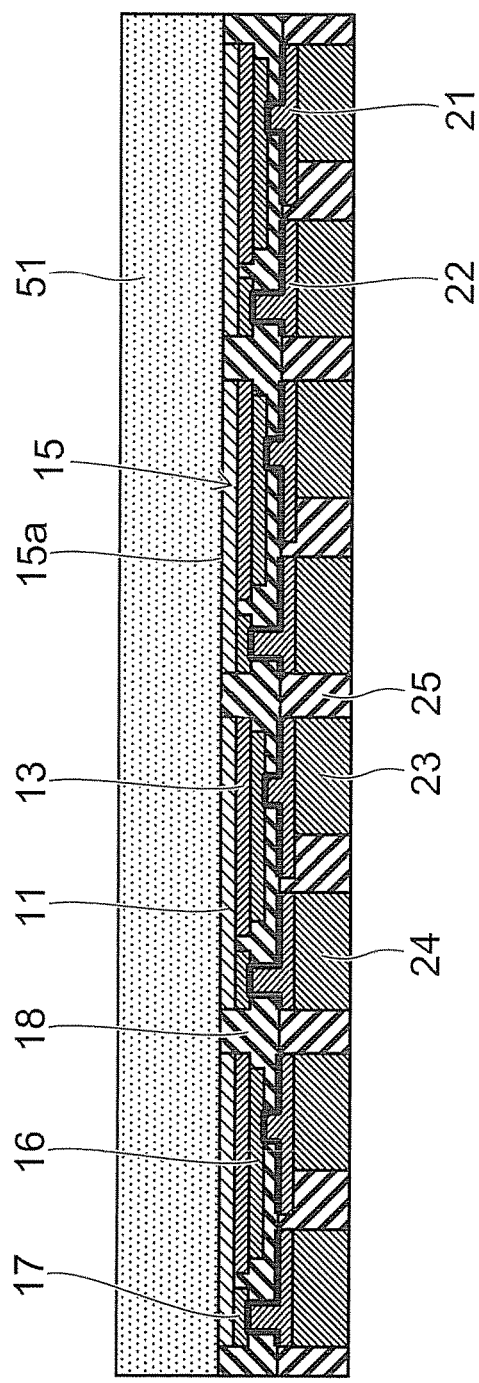
FIG. 9A
FIG. 9B

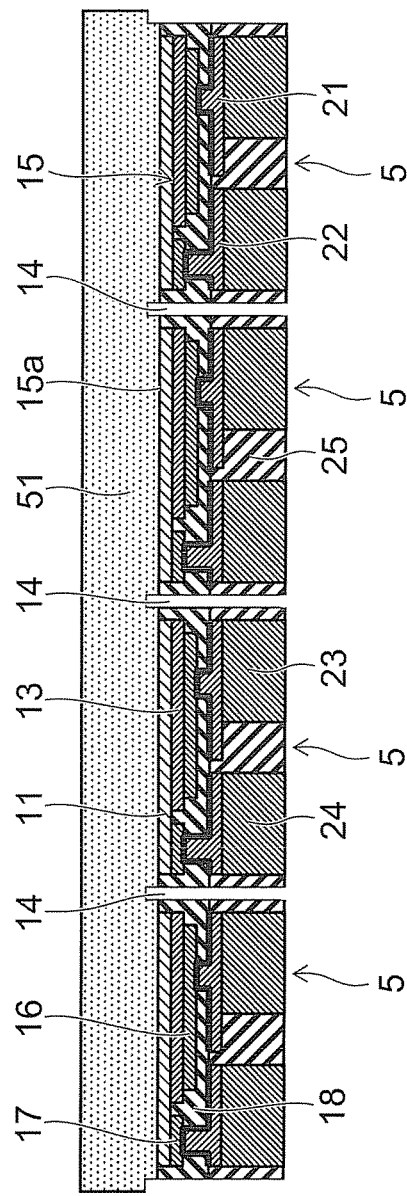
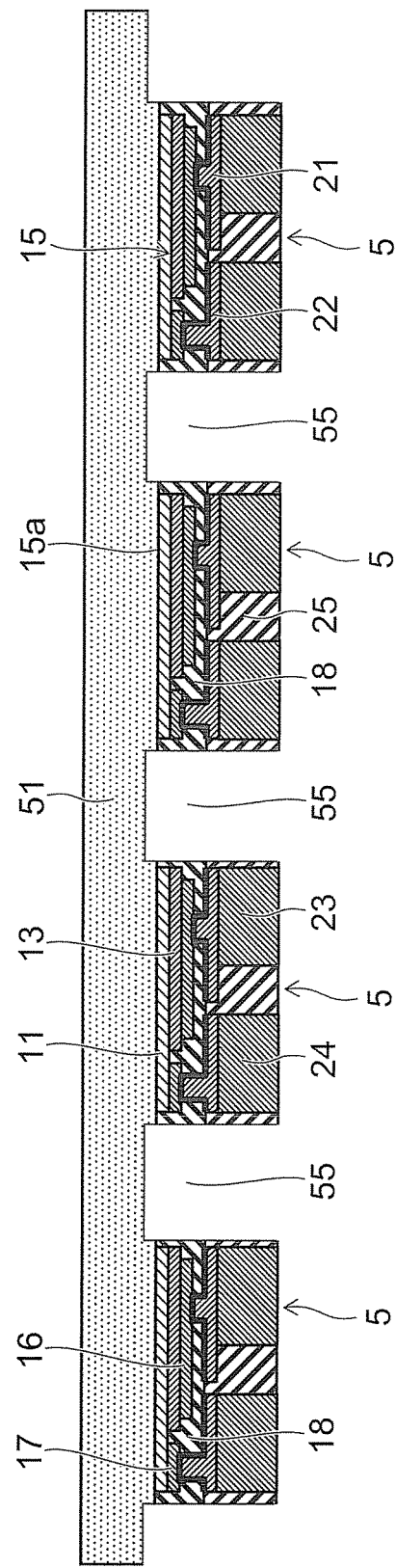

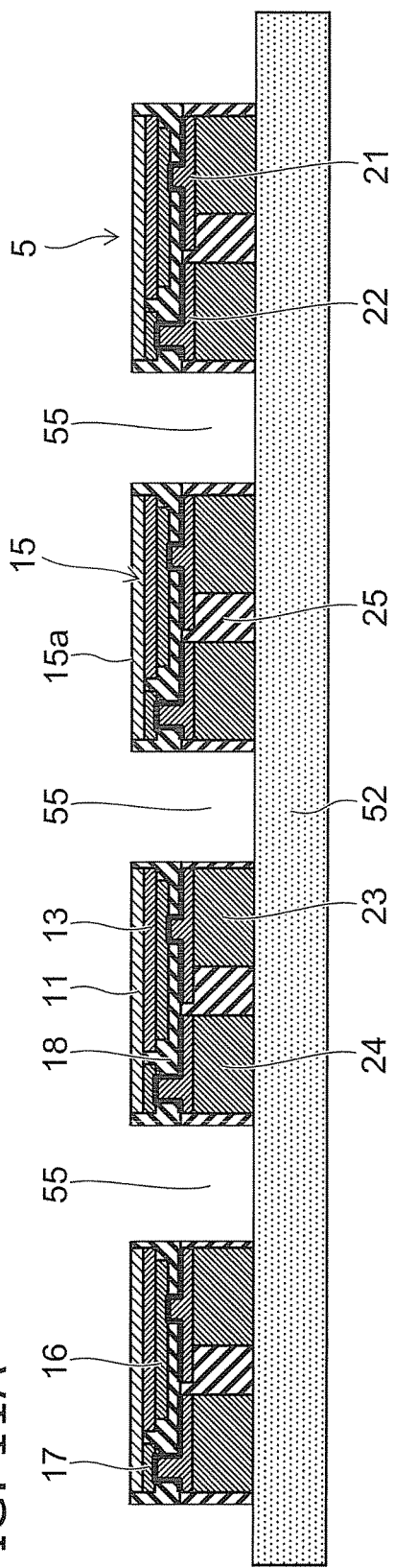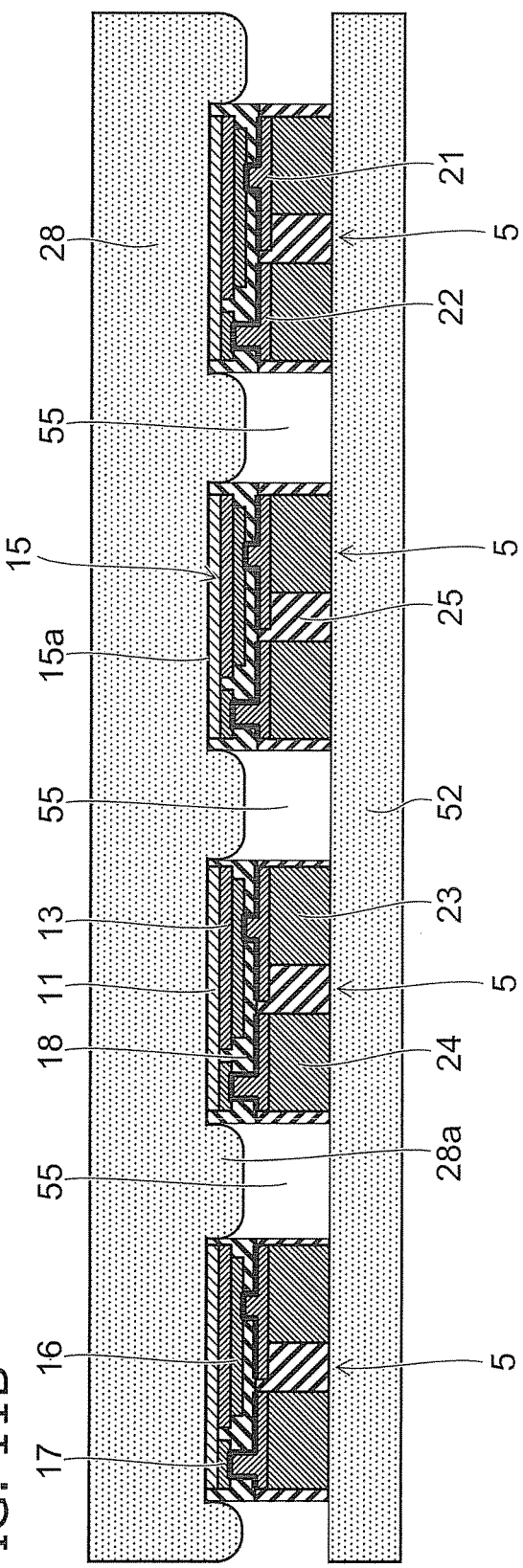

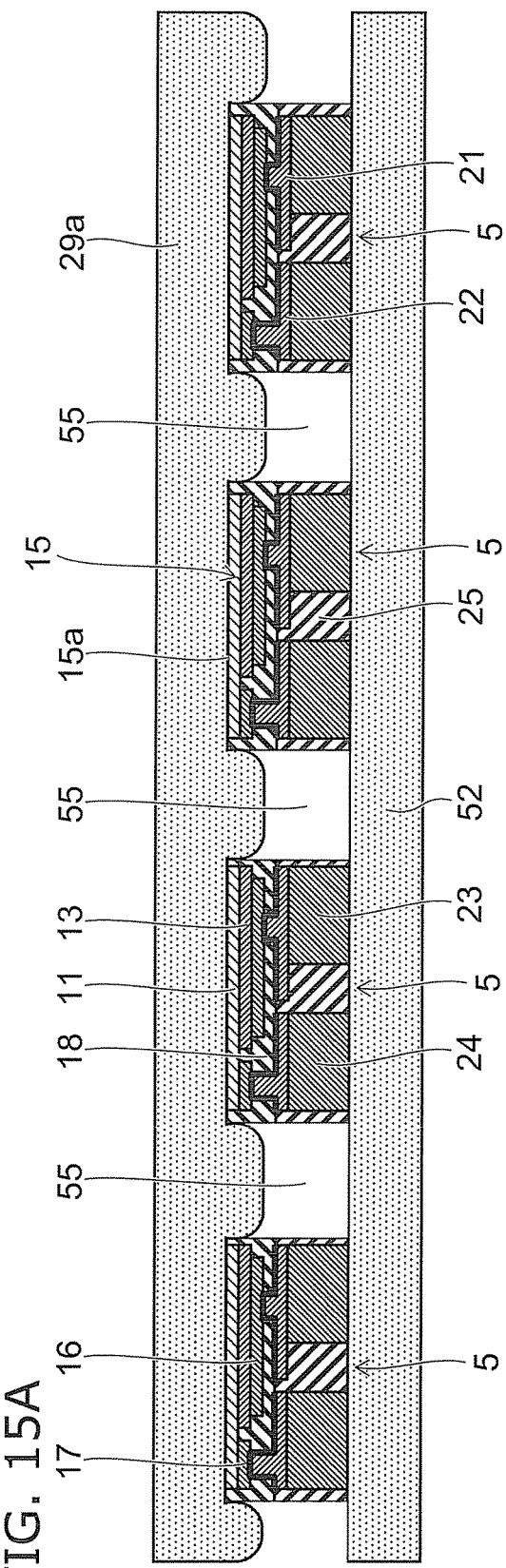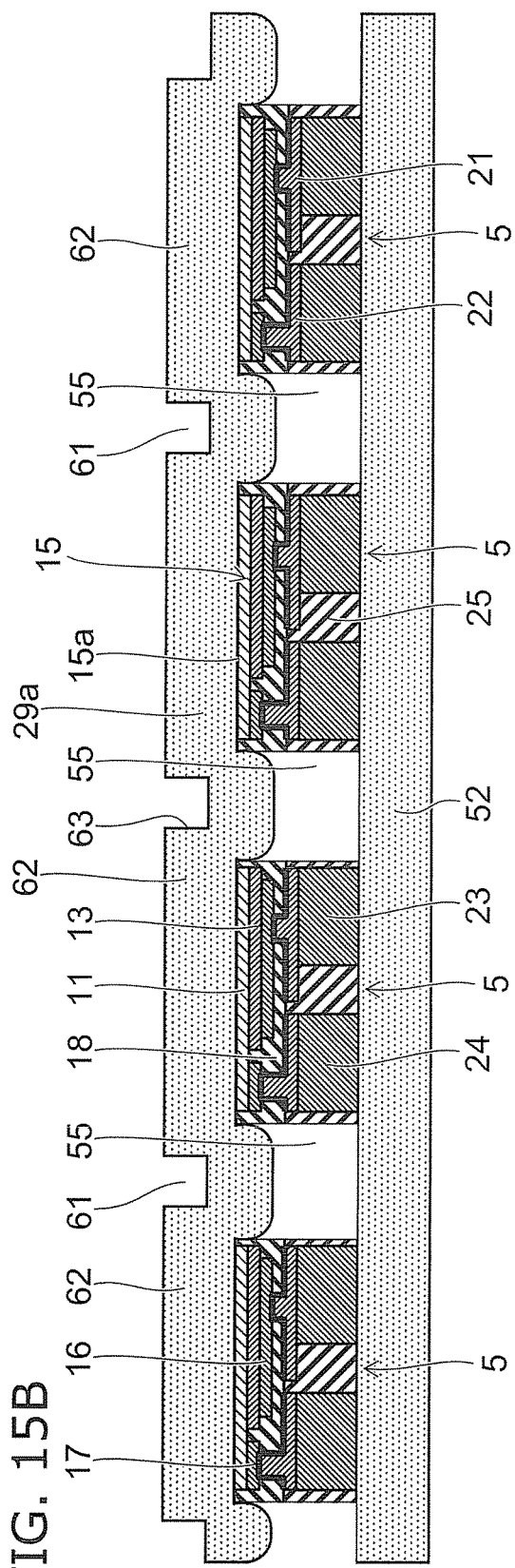

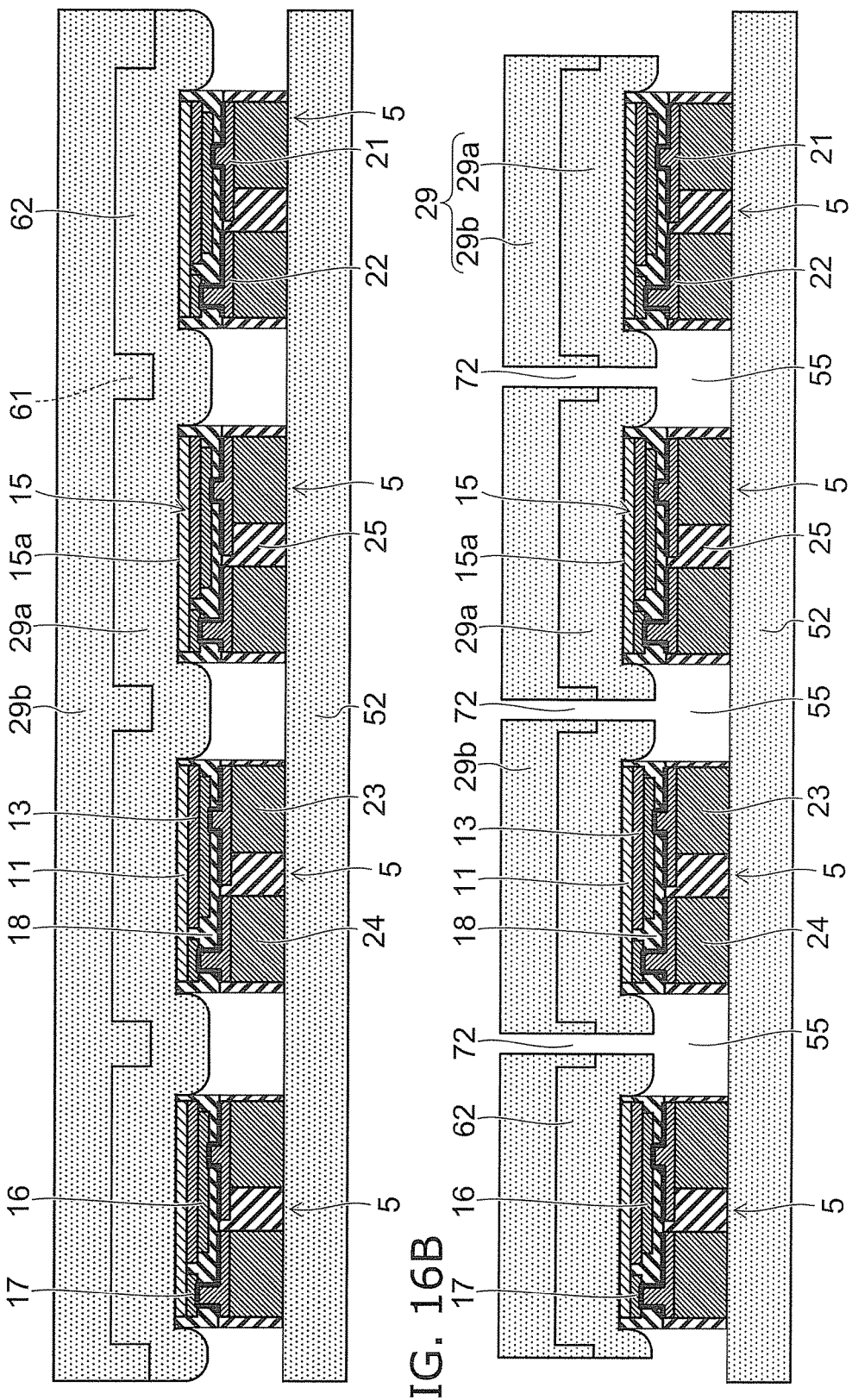

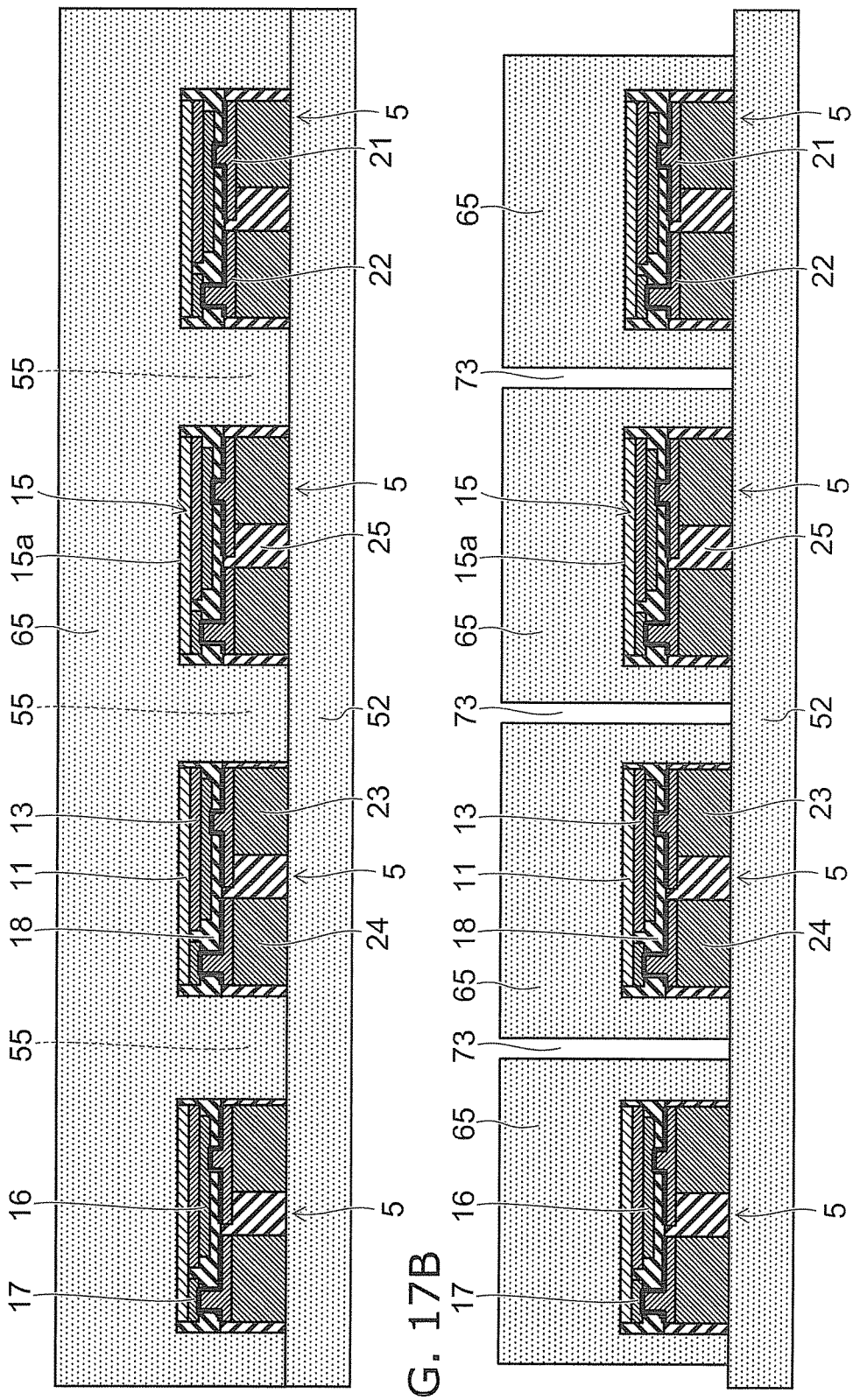

SEMICONDUCTOR LIGHT EMITTING DEVICE AND METHOD FOR MANUFACTURING SAME

CROSS-REFERENCE TO RELATED APPLICATION

This application is a continuation of application Ser. No. 12/886,709, filed Sep. 21, 2010, now allowed, which is based upon and claims the benefit of priority from Japanese Patent Application No. 2010-127967, filed on Jun. 3, 2010; the entire contents of each of which are incorporated herein by reference.

FIELD

Embodiments described herein relate generally to a semiconductor light emitting device and a method for manufacturing the same.

BACKGROUND

Wavelength conversion light emitting devices, which obtain white light by combining an excitation light source (blue light or near-ultraviolet Light Emitting Diode (LED) with a fluorescent material layer, are known. Such excitation light is emitted also from a side face of a light emitting layer. To suppress variation in color, it is desirable that excitation light emitted from the side face of the light emitting layer also travels through the fluorescent material layer.

BRIEF DESCRIPTION OF THE DRAWINGS

FIG. 2A to FIG. 12 are schematic views illustrating a method for manufacturing the semiconductor light emitting device of the first embodiment;

FIG. 15A to FIG. 16B are schematic cross-sectional views of the semiconductor light emitting device of the third embodiment; and FIGS. 17A and 17B are schematic views illustrating a method for manufacturing a semiconductor light emitting device of a fourth embodiment.

DETAILED DESCRIPTION

Figure 1:
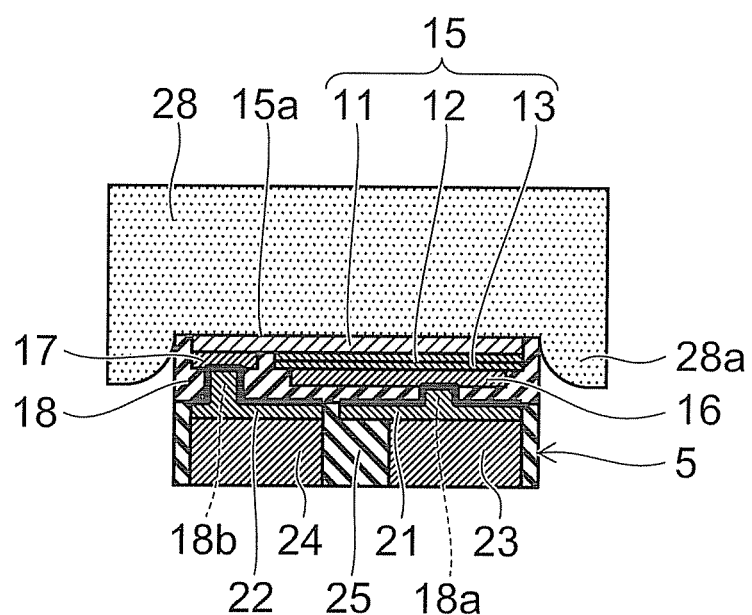
FIG. 1 is a schematic cross-sectional view of a semiconductor light emitting device of a first embodiment.

According to one embodiment, a semiconductor light emitting device includes a light emitting chip and a fluorescent material layer. The light emitting chip includes a semiconductor layer, a first electrode, a second electrode, an insulating layer, a first interconnect layer, a second interconnect layer, a first metal pillar, a second metal pillar, and a resin layer. The semiconductor layer includes a light emitting layer, a first major surface, and a second major surface opposite to the first major surface. The first electrode is provided on the second major surface in a region including the light emitting layer. The second electrode is provided on the second major surface. The insulating layer is provided on the second major surface side of the semiconductor layer. The first interconnect layer is provided in a first opening and on a face of the insulating layer on a side opposite to the semiconductor layer to connect to the first electrode. The first opening is formed to reach the first electrode. The second interconnect layer is provided in a second opening and on a face of the insulating layer on the side opposite to the semiconductor layer to connect to the second electrode. The second opening is formed to reach the second electrode. The first metal pillar is provided on a face of the first interconnect layer on a side opposite to the first electrode. The second metal pillar is provided on the face of the second interconnect layer on the side opposite to the second electrode. The resin layer is provided between the first metal pillar and the second metal pillar. The fluorescent material layer is provided on the first major surface and has a larger planer size than the light emitting chip.

Exemplary embodiments will now be described with reference to the drawings. Similar components in the drawings are marked with like reference numerals. In addition, the drawings illustrating processes show a part of a region in the wafer state.

First Embodiment

FIG. 1 is a schematic cross-sectional view of a semiconductor light emitting device of a first embodiment.

This semiconductor light emitting device includes a light emitting chip 5 and a fluorescent material layer 28. The light emitting chip 5 includes a semiconductor layer 15. The semiconductor layer 15 includes a first major surface 15a and a second major surface opposite to the first major surface 15a. Electrodes and interconnect layers are provided on the second major surface side. Light is extracted mainly from the first major surface 15a. The fluorescent material layer 28 is provided on the first major surface 15a.

The semiconductor layer 15 includes a first semiconductor layer 11 and a second semiconductor layer 13. The first semiconductor layer 11 is, for example, an n-type GaN layer that functions as a lateral current path. However, the conductivity type of the first semiconductor layer 11 is not limited to the n-type; and the conductivity type may be a p-type. The second semiconductor layer 13 has a stacked structure in which a light emitting layer (active layer) 12 is interposed between an n-type layer and a p-type layer.

The second major surface side of the semiconductor layer 15 is processed into a recessed and protruding configuration, and an upper level portion and a lower level portion are provided on the second major surface side. The upper level portion located at an upper level side than the lower level portion as viewed from the first major surface 15a, includes the light emitting layer 12. The lower level portion does not include the light emitting layer 12 and is provided outside the outer circumference (the end portion) of the light emitting layer 12.

A p-side electrode 16 is provided as a first electrode on the surface of the second semiconductor layer 13, which is the surface of the upper level portion. In other words, the p-side electrode 16 is provided in a region including the light emitting layer 12. An n-side electrode 17 is provided as a second electrode on the surface of the first semiconductor layer 11, which is the surface of the lower level portion.

FIG. 2B illustrates one example of a planar layout of the p-side electrode 16 and the n-side electrode 17. In one semiconductor layer 15, the surface area of the p-side electrode 16 is greater than the surface area of the n-side electrode 17. Accordingly, a light emitting region can be widely obtained.

The second major surface side of the semiconductor layer 15 is covered with an insulating layer 18. A side surface of the semiconductor layer 15 is covered with the insulating layer 18. The insulating layer 18 is also filled between the p-side electrode 16 and the n-side electrode 17. For example, the insulating layer 18 is a resin, such as polyimide, which exhibits excellent performance for patterning of minute openings. Alternatively, a silicon oxide may be used for the insulating layer 18.

A p-side interconnect layer 21 and an n-side interconnect layer 22 are provided as a first interconnect layer and a second interconnect layer, respectively, on a face of the insulating layer 18 on a side opposite to the semiconductor layer 15. The p-side interconnect layer 21 is also provided in a first opening 18*a* formed in the insulating layer 18 to reach the p-side electrode 16, and is connected to the p-side electrode 16. The n-side interconnect layer 22 is also provided in a second opening 18*b* formed in the insulating layer 18 to reach the n-side electrode 17, and is connected to the n-side electrode 17. As shown in FIG. 4B, the p-side interconnect layer 21 and the n-side interconnect layer 22 spread like a pad on the surface of the insulating layer 18.

A p-side metal pillar 23 is provided as a first metal pillar on a face of the p-side interconnect layer 21 on a side opposite to the p-side electrode 16. An n-side metal pillar 24 is provided as a second metal pillar on a face of the n-side interconnect layer 22 on a side opposite to the n-side electrode 17.

A resin layer 25 covers the periphery of the p-side metal pillar 23, the periphery of the n-side metal pillar 24, the p-side interconnect layer 21, and the n-side interconnect layer 22. The resin layer 25 is filled between the adjacent pillars. A lower face of the p-side metal pillar 23 and a lower face of the n-side metal pillar 24 are exposed from the resin layer 25.

The surface area of the n-side interconnect layer 22 connected to the n-side electrode 17 provided on the portion of the semiconductor layer 15 not including the light emitting layer 12 is greater at the face on the side opposite to the n-side electrode 17 than at the face on the n-side electrode 17 side. In other words, the contact surface area between the n-side interconnect layer 22 and the n-side metal pillar 24 is greater than the contact surface area between the n-side interconnect layer 22 and the n-side electrode 17. The contact surface area between the p-side interconnect layer 21 and the p-side metal pillar 23 is greater than the contact surface area between the p-side interconnect layer 21 and the p-side electrode 16. Alternatively, the contact surface area between the p-side interconnect layer 21 and the p-side metal pillar 23 may be smaller than the contact surface area between the p-side interconnect layer 21 and the p-side electrode 16. Further, a portion of the n-side interconnect layer 22 extends on the insulating layer 18 to a position to overlay below the light emitting layer 12.

Thereby, a larger draw out electrode can be formed via the n-side interconnect layer 22 from the n-side electrode 17 provided on a portion of the semiconductor layer 15 not including the light emitting layer 12 and having a small surface area while maintaining a high light output by having a larger light emitting layer 12.

The first semiconductor layer 11 is electrically connected to the n-side metal pillar 24 via the n-side electrode 17 and the n-side interconnect layer 22. The second semiconductor layer 13 is electrically connected to the p-side metal pillar 23 via the p-side electrode 16 and the p-side interconnect layer 21.

A surface processing film (e.g., a nonelectrolytic plating film such as Ni or Au, pre-coated solder, a volatile organic corrosion-protection film called Organic Solderbility Preservatives (OSP), or the like) is formed for corrosion protection on the surface (a lower face in FIG. 1) of each of the p-side metal pillar 23 and the n-side metal pillar 24 as necessary.

The lower face of the p-side metal pillar 23 and the lower face of the n-side metal pillar 24 are bonded to a pad on a mounting board via an external terminal such as, for example, solder balls, metal bumps, etc.

The materials of the n-side interconnect layer 22, the p-side interconnect layer 21, the n-side metal pillar 24, and the p-side metal pillar 23 may include copper, gold, nickel, silver, etc. Thereof, copper is more favorable because copper provides good thermal conductivity, high migration resistance, and excellent adhesion with insulating films.

Each of the thickness of the n-side metal pillar 24 and the thickness of the p-side metal pillar 23 (the thickness in the vertical direction in FIG. 1) is thicker than the thickness of a stacked body including the semiconductor layer 15, the n-side electrode 17, the p-side electrode 16, and the insulating film 18. The aspect ratios of the metal pillars 23 and 24 (the ratio of the thickness to the planar size) are not limited to 1 or more; and the ratios may be less than 1. In other words, the thicknesses of the metal pillars 23 and 24 may be smaller than the planar sizes thereof.

According to the structure of this embodiment, it is possible to maintain the mechanical strength even in the case where the semiconductor layer 15 is thin by increasing the thicknesses of the n-side metal pillar 24, the p-side metal pillar 23, and the resin layer 25. In the case of mounting on a mounting board, the n-side metal pillar 24 and the p-side metal pillar 23 can absorb and mitigate the stress applied to the semiconductor layer 15 via the external terminals.

The insulating layer 18 is patterned for formation of multiple minute openings 18*a* and 18*b*. Accordingly, a resin, such as polyimide, which exhibits excellent performance for patterning of minute openings, is desirably used for the insulating layer 18.

For the resin layer 25, it is desirable to use a resin that can be formed into a thick layer with low costs and is suitable for reinforcing the n-side metal pillar 24 and the p-side metal pillar 23. Further, it is desirable for the resin layer 25 to be a substance having a coefficient of thermal expansion equal to or near that of the mounting board. Examples of such a resin layer 25 may include, for example, epoxy resin, silicon resin, fluorocarbon resin, etc.

The fluorescent material layer 28 is provided on the first major surface 15*a* of the semiconductor layer 15. The fluorescent material layer 28 is capable of absorbing the light from the light emitting layer 12 and emitting a wavelength-converted light. Therefore, it is possible to emit a mixed light of the light from the light emitting layer 12 and the wavelength-converted light of the fluorescent material layer 28.

For example, in the case where the light emitting layer 12 is nitride-based, white light or lamp light can be obtained as a mixed color of blue light from the light emitting layer 12 and, for example, yellow light which is wavelength-converted light of the yellow fluorescent material layer 28. Alternatively, the fluorescent material layer 28 may include multiple types of fluorescent materials (e.g., a red fluorescent material and a green fluorescent material).

The planar size of the insulating layer 18 is larger than the planar size of the semiconductor layer 15, and the insulating film 18 covers the side face of the semiconductor layer 15. The fluorescent material layer 28 is provided also on the insulating layer 18 covering the side face of the semiconductor layer 15 around the first major surface 15*a*. Further, the fluorescent material layer 28 is provided in such a manner as to protrude outside the insulating layer 18.

The planar size of the fluorescent material layer 28 is larger than the planar size of the light emitting chip 5. The planar size of the insulating layer 18 and the planar size of the resin layer 25 are substantially the same. Accordingly, the planar size of the light emitting chip 5 corresponds to the planar size of the insulating layer 18 or the resin layer 25.

The light emitted by the light emitting layer 12 travels mainly through the first semiconductor layer 11, the first major surface 15a, and the fluorescent material layer 28 to be emitted externally. The light is not limited to being emitted in the direction directly upward from the first major surface 15a and may be emitted also in a direction oblique to the first major surface 15a. In particular, light emitted from the side face of the semiconductor layer 15, travelling obliquely, and emitted externally from the side surface of the fluorescent material layer 28 tends to have a short distance of travelling in the fluorescent material layer 28 compared to light emitted externally from directly above the fluorescent material layer 28. This can be a factor for variation in color between the center portion and the outer circumference portion of a light emitting surface.

In this embodiment, since the planar size of the fluorescent material layer 28 is larger than the planar size of the light emitting chip 5, the light emitted obliquely upward from the semiconductor layer 15 can travel through a larger portion of the fluorescent material layer 28 than the planar size of the light emitting chip 5. As a result, the distance of traveling in the fluorescent material layer 28 becomes long, and variation in color can be suppressed.

Further, a portion 28a of the fluorescent material layer 28 on the outer circumference side of the light emitting chip 5 protrudes from the first major surface 15 to the insulating film 18 side, and the portion 28a covers the side face of the semiconductor layer 15 via the insulating layer 18. Accordingly, light emitted from the side face of the semiconductor layer 15 can certainly travel through the fluorescent material layer 28. As a result, light components not travelling through the fluorescent material layer 28 are reduced, so that a semiconductor light emitting device excellent in color tone controllability can be provided.

Next, a method for manufacturing the semiconductor light emitting device of the first embodiment will be described with reference to FIG. 2A to FIG. 12.

First, the first semiconductor layer 11 is formed on a major surface of a substrate 10, and the second semiconductor layer 13 including the light emitting layer 12 is formed thereon. In the case where such layers of the semiconductor layer 15 are, for example, nitride semiconductors, the semiconductor layer 15 may be formed by, for example, crystal growth on a sapphire substrate.

Then, as shown in FIG. 2A and FIG. 2B, which is the bottom view thereof, a separating trench 14 is made to pierce the semiconductor layer 15 and reach the substrate 10 by, for example, Reactive Ion Etching (RIE) using a non-illustrated resist. The separating trench 14 is formed, for example, in a lattice configuration on the substrate 10 in the wafer state and separates the semiconductor layer 15 into multiple pieces.

In addition, a portion of the second semiconductor layer 13 including the light emitting layer 12 is removed by, for example, RIE using a non-illustrated resist to expose a portion of the first semiconductor layer 11. Thereby, the upper level portion and the lower level portion are formed on the second major surface side of the semiconductor layer 15. As viewed from the substrate 10, the upper level portion is located relatively in the upper level, and the lower level portion is located in the lower level of the substrate side than the upper level portion. The upper level portion includes the light emitting layer 12, and the lower level portion does not include the light emitting layer 12.

Then, the p-side electrode 16 is formed on the surface of the upper level portion (the surface of the second semiconductor layer 13), and the n-side electrode 17 is formed on the surface of the lower level portion (the surface of the first semiconductor layer 11). Any one of the p-side electrode 16 and the n-side electrode 17 may be formed first, or the p-side electrode 16 and the n-side electrode 17 may be formed simultaneously with the same material.

Next, after covering all exposed portions on the substrate 10 with the insulating layer 18, as shown in FIG. 3A, the first opening 18a and the second opening 18b are selectively formed in the insulating layer 18 by patterning the insulating layer 18 with, for example, wet etching. The first opening 18a reaches the p-side electrode 16. The second opening 18b reaches the n-side electrode 17. The insulating layer 18 is filled into the separating trench 14.

Continuing, as shown in FIG. 3B, a continuous seed metal 19 is formed on the surface of the insulating layer 18 and on the inner faces of the first opening 18a and the second opening 18b. Further, a resist 41 is selectively formed on the seed metal 19, and Cu electrolytic plating is performed using the seed metal 19 as a current path.

Thereby, the p-side interconnect layer 21 and the n-side interconnect layer 22 are selectively formed on the seed metal 19 as shown in FIG. 4A and FIG. 4B, which is the bottom view thereof. The p-side interconnect layer 21 and the n-side interconnect layer 22 are made of a copper material formed simultaneously by plating. The p-side interconnect layer 21 is formed also in the first opening 18a and is connected to the p-side electrode 16 via the seed metal 19. The n-side interconnect layer 22 is formed also in the second opening 18b and is connected to the n-side electrode 17 via the seed metal 19.

A face of the n-side interconnect layer 22 on a side opposite to the n-side electrode 17 has a larger surface area than a face of the n-side interconnect layer 22 connected to the n-side electrode 17, and the n-side interconnect layer 22 is formed like a pad on the surface of the insulating film.

The resist 41 used during the plating of the p-side interconnect layer 21 and the n-side interconnect layer 22 is removed with, for example, a chemical solution (FIG. 5A). Thereafter, as shown in FIG. 5B, another resist 42 is formed for forming metal pillars, and Cu electrolytic plating is performed using the seed metal 19 as a current path. The resist 42 is thicker than the resist 41.

Figure 6A:
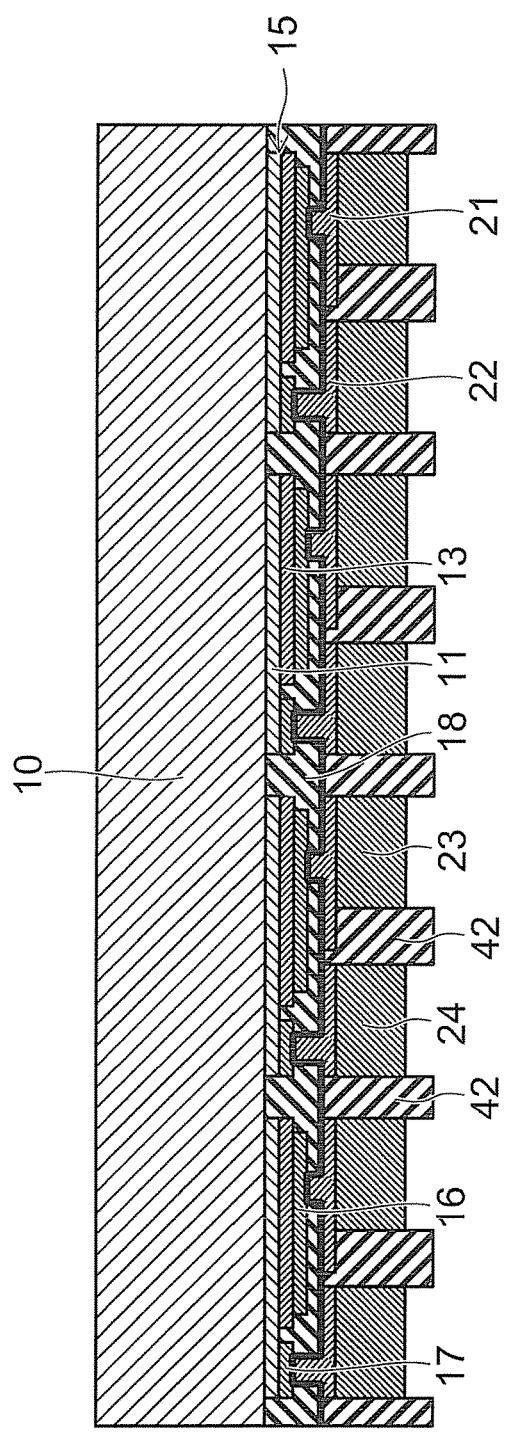
Figure 6B:
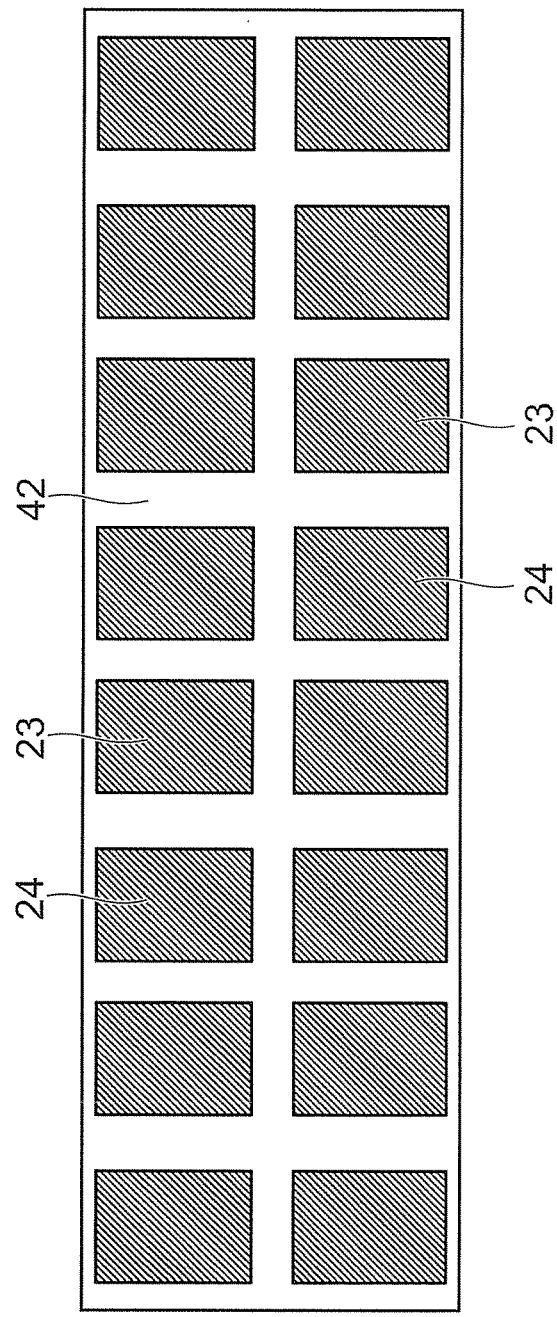

Thereby, as shown in FIG. 6A and FIG. 6B, which is a bottom view thereof, the p-side metal pillar 23 is formed on the surface of the p-side interconnect layer 21, and the n-side metal pillar 24 is formed on the surface of the n-side interconnect 22. The p-side metal pillar 23 and the n-side metal pillar 24 are made of a copper material formed simultaneously by plating.

The resist 42 is removed with, for example, a chemical solution as shown in FIG. 7A. Thereafter, using the p-side metal pillar 23 and the n-side metal pillar 24 as a mask, the exposed portions of the seed metal 19 are removed by wet etching (FIG. 7B). Thereby, the electrical connection between the p-side interconnect layer 21 and the n-side interconnect layer 22 via the seed metal 19 is divided.

Next, as shown in FIG. 8A, the resin layer 25 is stacked on the insulating layer 18. The resin layer 25 is filled between the p-side interconnect layer 21 and the n-side interconnect layer 22 and between the p-side metal pillar 23 and the n-side metal pillar 24. The resin layer 25 covers each of the side face of the p-side metal pillar 23 and the side face of the n-side metal pillar 24.

Thereafter, the substrate 10 is removed as shown in FIG. 8B. The substrate 10 is removed by, for example, laser lift-off. Specifically, laser light is irradiated from the backside of the substrate 10 toward the first semiconductor layer 11. The substrate 11 is permeable to the laser light; and the laser light has a wavelength in the absorption region of the first semiconductor layer 11.

When the laser light reaches the interface between the substrate 10 and the first semiconductor layer 11, the first semiconductor layer 11 proximal to the interface absorbs the energy of the laser light and decomposes. For example, in the case where the first semiconductor layer 11 is GaN, the first semiconductor layer 11 decomposes into Ga and nitrogen gas. A micro gap is formed between the substrate 10 and the first semiconductor layer 11 by the decomposition reaction; and the substrate 10 and the first semiconductor layer 11 separate.

The irradiation of the laser light is performed over the entire wafer by performing multiply for each set region; and the substrate 1 is removed. The light extraction efficiency can be increased by removing the substrate 10 from the top of the first major surface 15a.

The face from which the substrate 10 is removed is cleaned and further is roughened by a frosting process. The light extraction efficiency can be increased by roughening the first major surface 15a.

Next, as shown in FIG. 9A, a stretchable tape (or a sheet) 51 is attached onto the first major surface 15a and the insulating layer 18 filled in the separating trench 14. For example, the tape 51 has a structure in which an adhesive is formed on a support made of a resin material.

The tape 51 is attached to a stacked body in the wafer state in which multiple semiconductor layers 15, the electrodes 16 and 17, the interconnect layers 21 and 22, and the metal pillars 23 and 24 are joined together by the insulating layer 18 and the resin layer 25.

Then, in such a state, as shown in FIG. 9B, a back face of the resin layer 25 is grounded to expose a lower face of the p-side metal pillar 23 and a lower face of the n-side metal pillar 24.

Next, as shown in FIG. 10A, the insulating layer 18 and the resin layer 25 are diced at the position of the separating trench 14. The tape 51 is not divided, and the continuous state is maintained. Thereby, the stacked body described above is divided into multiple light emitting chips 5 while being supported by the tape 51.

The substrate 10 is removed before the stacked body is diced. Further, the semiconductor layer 15 does not exist in the separating trench 14. By filing a resin as the insulating layer 18 into the separating trench 14, the dicing is easy and the productivity can be increased. Further, damage to the semiconductor layer 15 during the dicing can be avoided. Also, a structure in which the side face of the semiconductor layer 15 is covered with the resin and protected can be obtained after the dicing.

Because each process before the singulation are performed collectively in the wafer state, it is unnecessary to perform interconnections and packaging for each of the singulated light emitting chips 5; and it is possible to drastically reduce production costs. In other words, the interconnections and the packaging are already complete in the singulated state. Also, inspections are possible at the wafer level. Therefore, the productivity can be increased. As a result, cost reductions are easy.

Next, as shown in FIG. 10B, the tape 51 is stretched to widen the pitch between the multiple light emitting chips 5 from a first pitch on the substrate 10 to a second pitch. In other words, the width of a gap 55, which is formed by stretching the tape 51, between the multiple light emitting chips 5 is larger than the width of the separating trench 14 formed on the substrate 10.

Next, a support 52 shown in FIG. 11A is attached on each mounting face (the lower faces of the metal pillars 23 and 24 and the resin layer 25) of the multiple light emitting chips 5 placed at the second pitch. Then, the tape 51 is peeled off. The support 52 is, for example, an adhesive tape made of a resin. The multiple light emitting chips 5 are supported on the support 52 at the second pitch.

In such a state, as shown in FIG. 11B, the fluorescent material layer 28 in a film form is attached to the first major surface 15a of each of the light emitting chips 5. The fluorescent material layer 28 is provided also above the gap 55 and is connected without being divided at a portion between the adjacent light emitting chips 5. A portion of the fluorescent material layer 28 slightly protrudes and enters into the gap 55 because a viscous property thereof. The multiple light emitting chips 5 are placed with respect to the film-form fluorescent material layer 28 at the second pitch which is larger than the first pitch on the substrate 10.

Figure 12:
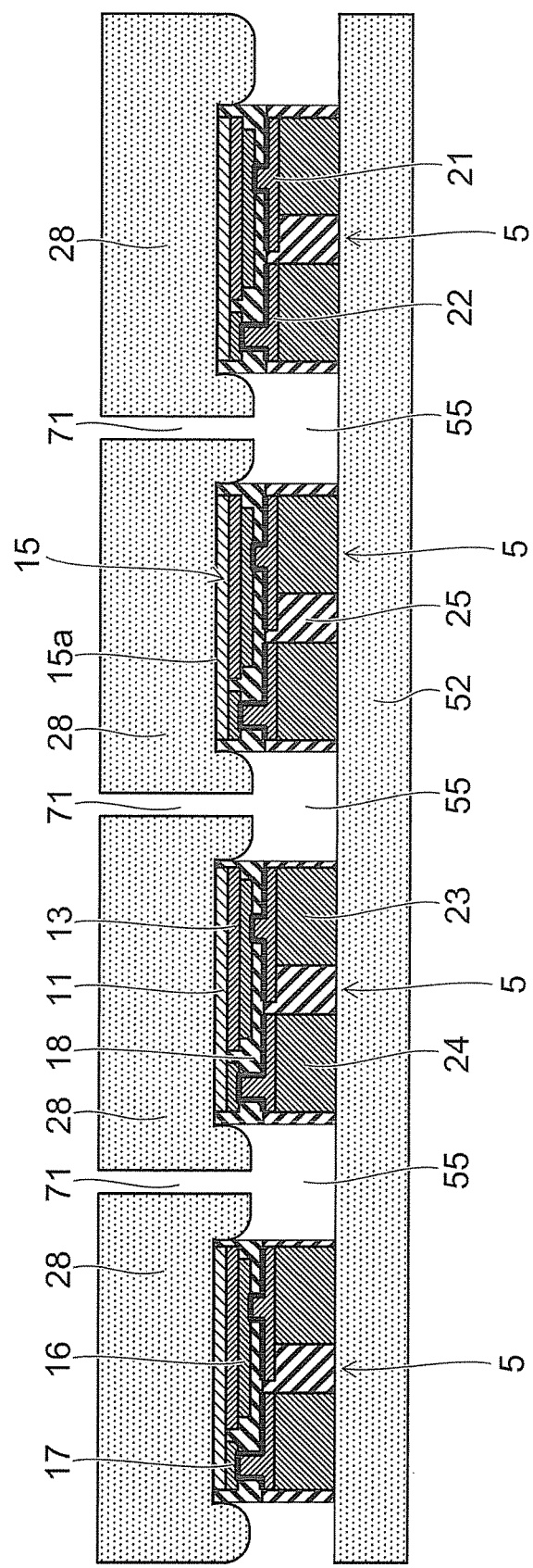

Thereafter, as shown in FIG. 12, the fluorescent material layer 28 is diced at a portion above the gap 55 between the multiple light emitting chips 5. Thereby, the semiconductor light emitting device including the light emitting chip 5 and the fluorescent material layer 28 is singulated.

The width of a trench 71 formed by dicing the fluorescent material layer 28 (a dicing width) is smaller than the width of the gap 55 (the second pitch). Accordingly, the singulated fluorescent material layer 28 is provided in such a manner as to protrude outside an upper face of each of the light emitting chips 5, and the planar size of the fluorescent material layer 28 is larger than the planar size of the light emitting chip 5. After singulation, each semiconductor light emitting device is picked up from the support 52.

The fluorescent material layer 28 is not diced during the singlulation of the light emitting chips 5 as described with reference to FIG. 10A. The resin layer 25 and the insulating layer 18 are both made of a resin material. Accordingly, for the singulation of the light emitting chips 5, a dicing method suitable for a resin can be selected, and the dicing region (the width of the separating trench 14) can be made narrow. By narrowing the dicing region, which is an ineffective region not functioning as a device, the number of chips obtained from one wafer can be increased, and cost reductions can be achieved.

As a method for securing the wide gap 55 between the light emitting chips 5 without using the tape 51 to widen the pitch between the light emitting chips 5, a method of widely forming a dicing line portion, which is an ineffective region not functioning as a device, on the wafer may be considered. However, this method decreases the number of chips obtained from one wafer. In this embodiment, it is unnecessary to provide a dicing line portion of the width of the wide gap 55 on the wafer; and therefore the increase of ineffective regions can be avoided.

Note that there is no problem even if stretching the tape 51 in the process of FIG. 10B causes a difference in the pitches between the multiple light emitting chips 5. This is because a process that requires alignment after the process of FIG. 10B is only the process for dicing the fluorescent material layer 28, and this process does not require high accuracy.

Second Embodiment

Figure 13:
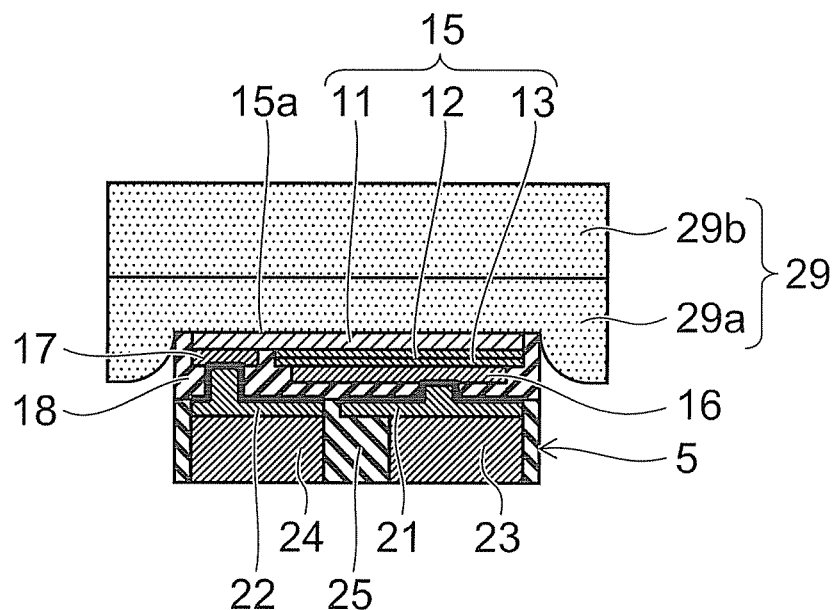
FIG. 13 is a schematic cross-sectional view of a semiconductor light emitting device of a second embodiment.

FIG. 13 is a schematic cross-sectional view of a semiconductor light emitting device of a second embodiment.

A fluorescent material layer 29 of this embodiment includes a first fluorescent material layer 29a provided on the first major surface 15a and a second fluorescent material layer 29b provided on the first fluorescent material layer 29a. The first fluorescent material layer 29a and the second fluorescent material layer 29b are both formed in a film form.

Between these multiple fluorescent material layers 29a and 29b, the fluorescent material layer 29a provided on the first major surface 15a has a longer peak wavelength of fluorescence excited by light from the light emitting layer 12. In other words, the second fluorescent material layer 29b includes a second fluorescent material having a shorter fluorescence peak wavelength than a first fluorescent material included in the first fluorescent material layer 29a. The fluorescent material layer 29 may have a stacked structure of three or more layers.

High color rendition can be obtained by using multiple fluorescent materials having different fluorescence peak wavelengths. The color rendition is the property determining how the color of an object appears in the case where a light source is used for illumination. Further, white light or lamp light can be obtained with high color rendition by using a substance that emits blue light as the light emitting layer 12 and using a red fluorescent material that emits red light and a green fluorescent material that emits green light as the fluorescent materials.

Moreover, the light emission of the first fluorescent material is not used to excite the second fluorescent material by having a layered structure in which the first fluorescent material layer 29a including a red fluorescent material is provided as the first fluorescent material on the first major surface 15a side and the second fluorescent material layer 29b including a green fluorescent material is provided thereon as the second fluorescent material having a shorter fluorescence peak wavelength than the first fluorescent material. Therefore, the decrease of the efficiency can be suppressed. As a result, highly-efficient light emitting characteristics can be realized.

The fluorescent material layer 29 is not limited to having a layered structure, and the fluorescent material layer 29 may have a structure in which multiple types of fluorescent materials having different fluorescence peak wavelengths are dispersed in a transparent resin. The transparent resin is permeable to the light emitted by the light emitting layer 12 and the fluorescent materials and is, for example, a silicon resin or the like.

In this embodiment as well, since the planar size of the fluorescent material layer 29 is larger than the planar size of the light emitting chip 5, the light emitted obliquely upward from the semiconductor layer 15 can travel through a larger portion of the fluorescent material layer 29 than the planar size of the light emitting chip 5. As a result, variation in color can be suppressed.

Third Embodiment

Figure 14:
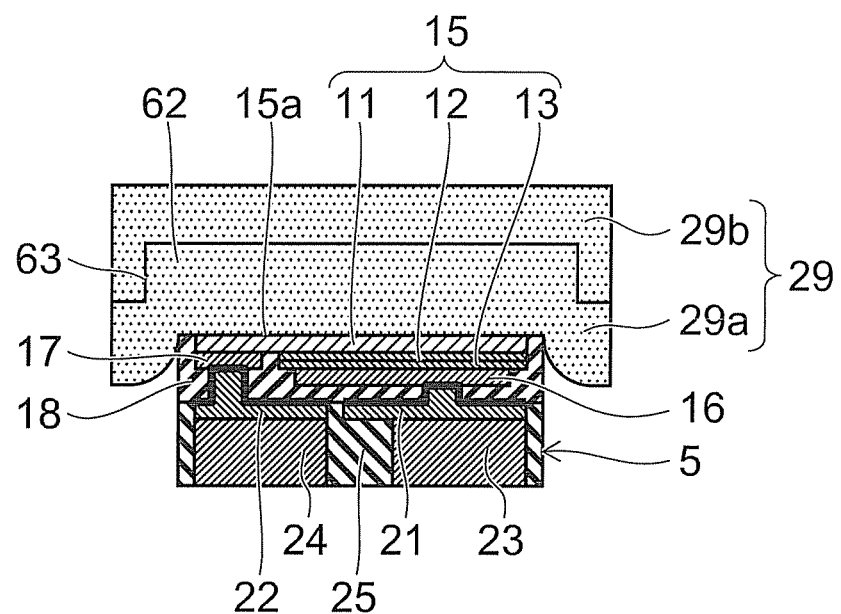
FIG. 14 is a schematic cross-sectional view of a semiconductor light emitting device of a third embodiment.

FIG. 14 is a schematic cross-sectional view of a semiconductor light emitting device of a third embodiment.

In this embodiment as well, the fluorescent material layer 29 includes the first fluorescent material layer 29a provided on the first major surface 15a and the second fluorescent material layer 29b provided on the first fluorescent material layer 29a.

Since the fluorescent material layer 29 has a larger planar size than the light emitting chip 5, the light emitted obliquely upward from the semiconductor layer 15 can travel through a larger portion of the fluorescent material layer 29 than the planar size of the light emitting chip 5. As a result, variation in color can be suppressed.

Further, the second fluorescent material layer 29b includes the second fluorescent material having a shorter fluorescence peak wavelength than the first fluorescent material included in the first fluorescent material layer 29a. As a result, high color rendition can be obtained. Also, the light emission of the first fluorescent material is not used to excite the second fluorescent material by having a layered structure in which the first fluorescent material layer 29a including a red fluorescent material is provided as the first fluorescent material on the first major surface 15a side and the second fluorescent material layer 29b including a green fluorescent material is provided thereon as the second fluorescent material having a shorter fluorescence peak wavelength than the first fluorescent material. Therefore, the decrease of the efficiency can be suppressed. As a result, highly-efficient light emitting characteristics can be realized.

Moreover, in this embodiment, a protruding portion 62 is formed in the first fluorescent material layer 29a on a side opposite to the first major surface 15a. Then, the second fluorescent material layer 29b is provided on the first fluorescent material layer 29a in such a manner as to cover an upper face and side face 63 of the protruding portion 62. The side face 63 of the protruding portion 62 is provided outside the side face of the light emitting chip 5. Accordingly, a structure in which the first fluorescent material layer 29a overlaps with the second fluorescent material layer 29b in a lateral direction is provided in a portion on the outer circumference side of an upper face of the light emitting chip 5.

Therefore, a light component that travels obliquely upward from the semiconductor layer 15 and is emitted externally from the side face of the fluorescent material layer 29 can travel through both of the first fluorescent material layer 29a and the second fluorescent material layer 29b. As a result, variation in color can be suppressed.

Next, with reference to FIG. 15A to FIG. 16B, a method for manufacturing the semiconductor light emitting device of this embodiment will be described.

The manufacturing method up to the process in which the singulated multiple light emitting chips 5 are supported on the support 52 at the second pitch is the same as that of the first embodiment described earlier.

In such a state, as shown in FIG. 15A, the first fluorescent material layer 29a in film form is attached to the first major surface 15a of each of the light emitting chips 5. The first fluorescent material layer 29a is provided also above the gap 55 between the adjacent light emitting chips 5 and is connect without being separated at the portion between the adjacent light emitting chips 5.

Thereafter, as shown in FIG. 15B, recessed portions 61 are formed in the first fluorescent material layer 29a. The recessed portion 61 is formed in a portion of the first fluorescent material layer 29a above the gap 55 between the multiple light emitting chips 5. The width of the recessed portion 61 is smaller than the width of the gap 55. By the formation of the recessed portions 61, the protruding portion 62 is formed on the first major surface 15a between the recessed portions 61.

Next, as shown in FIG. 16A, the second fluorescent material layer 29b is formed on the first fluorescent material layer 29a. At this time, the second fluorescent material layer 29b is filled into the recessed portions 61.

Then, as shown in FIG. 16B, the second fluorescent material layer 29b and the first fluorescent material layer 29a are diced at the positions of the recessed portions 61 and the gaps 55. Thereby, the semiconductor light emitting device including a stacked structure of the first fluorescent material layer 29a and the second fluorescent material layer 29b provided on the light emitting chip 5 is singulated.

The width of a trench 72 (dicing width) formed by dicing the fluorescent material layer 29 is smaller than the width of the gap 55 (the second pitch). Accordingly, the singulated fluorescent material layer 29 is provided in such a manner as to protrude outside the upper face of each of the light emitting chips 5. Therefore, the planar size of the fluorescent material layer 29 is larger than the planar size of the light emitting chip 5.

Moreover, the width of the trench 72 is smaller than the width of the recessed portion 61. Accordingly, a structure in which the first fluorescent material layer 29a overlaps with the second fluorescent material layer 29b in the lateral direction is obtained in a portion protruding outside the side face of the light emitting chip 5.

Fourth Embodiment

The method of joining the fluorescent material layer to the multiple light emitting chips 5 is not limited to attaching a fluorescent material layer in film form to the light emitting chips 5. A fluorescent material layer in liquid form may be applied.

As shown in FIG. 17A, a fluorescent material layer 65 in which fluorescent materials are dispersed in a transparent resin in liquid form is supplied on the support 52 supporting the multiple light emitting chips 5 placed at the second pitch. The fluorescent material layer 65 is provided on the first major surface 15a and also filled into the gap 55. The transparent resin is permeable to the light emitted by the light emitting layer 12 and the fluorescent materials and is, for example, a silicon resin or the like.

The transparent resin is then cured. Thereafter, as shown in FIG. 17B, the fluorescent material layer 65 is diced at the positions of the gaps 55. Thereby, the semiconductor light emitting device including the light emitting chip 5 and the fluorescent material layer 65 is singulated.

The width of a trench 73 (dicing width) formed by dicing the fluorescent material layer 65 is smaller than the width of the gap 55 (the second pitch). Accordingly, the singulated fluorescent material layer 65 is provided in such a manner as to protrude outside the upper face of the light emitting chip 5. Therefore, the planer size of the fluorescent material layer 65 is larger than the planer size of the light emitting chip 5. Accordingly, the light emitted obliquely upward from the semiconductor layer 15 can travel through a larger portion of the fluorescent material layer 65 than the planer size of the light emitting chip 5. As a result, variation in color can be suppressed.

Further, in this embodiment, the fluorescent material layer 65 in liquid form is filled into the gaps 55 and is cured thereafter. Accordingly, a structure can be obtained in which the fluorescent material layer 65 covers the entire upper face and side face of the light emitting chip 5 except for the mounting face (lower face). Accordingly, there is no light component which does not travel through the fluorescent material layer 65, and it is possible to suppress color unevenness.

In the embodiments described above, the substrate 10 may not be removed entirely; and the substrate 10 may be polished to thinly remain on the first major surface 15a. By leaving the substrate 10 in a thin layer, the mechanical strength can be higher than that of the structure in which the substrate 1 is entirely removed; and a structure having high reliability can be provided.

As the fluorescent material layer, a red fluorescent material layer, a yellow fluorescent material layer, a green fluorescent material layer, and a blue fluorescent material layer can be used, and examples are given below for each of the fluorescent material layers.

For example, the red fluorescent material layer can contain a nitride-based fluorescent material $CaAlSiN_3$:Eu or a SiAlON-based fluorescent material.

In the case where the SiAlON-based fluorescent material is used, it may be used:

$$(M_{1-x}R_x)_{a1}AlSi_{b1}O_{c1}N_{d1} \qquad \text{Compositional Formula (1)}$$

(M is at least one type of metal element excluding Si and Al, and it may be desirable for M to be at least one selected from Ca and Sr. R is a light emission center element, and it may be desirable for R to be Eu. Here, x, a1, b1, c1, and d1 satisfy the following relationships $0<x\leq1$, $0.6<a1<0.95$, $2<b1<3.9$, $0.25<c1<0.45$, $4<d1<5.7$).

By using the SiAlON-based fluorescent material of Compositional Formula (1) recited above, the temperature characteristics of the wavelength conversion efficiency can be improved; and the efficiency in the high current density region can be increased further.

For example, the yellow fluorescent material layer can contain a silicate-based fluorescent material $(Sr, Ca, Ba)_2SiO_4$:Eu.

For example, the green fluorescent material layer can contain a halphosphate-based fluorescent material $(Ba, Ca, Mg)_{10}(PO_4)_6.Cl_2$:Eu or a SiAlON-based fluorescent material.

In the case where the SiAlON-based fluorescent material is used, it may be used:

$$(M_{1-x}R_x)_{a2}AlSi_{b2}O_{c2}N_{d2} \qquad \text{Compositional Formula (2)}$$

(M is at least one type of metal element excluding Si and Al, and it may be desirable for M to be at least one selected from Ca and Sr. R is a light emission center element, and it may be desirable for R to be Eu. Here, x, a2, b2, c2, and d2 satisfy the following relationships $0<x\leq1$, $0.93<a2<1.3$, $4.0<b2<5.8$, $0.6<c2<1$, $6<d2<11$).

By using the SiAlON-based fluorescent material of Compositional Formula (2) recited above, the temperature characteristics of the wavelength conversion efficiency can be improved; and the efficiency in the high current density region can be increased further.

For example, the blue fluorescent material layer can contain an oxide-based fluorescent material $BaMgAl_{10}O_{17}$:Eu.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A method for manufacturing a semiconductor light emitting device, comprising:
   forming a semiconductor layer on a substrate, the semiconductor layer including a first surface, a second surface opposite to the first surface, and a light emitting layer;
   forming a separating trench separating the semiconductor layer into a plurality of semiconductor layers on the substrate;
   forming a first electrode at a region including the light emitting layer on the first surface on a side opposite to the substrate;
   forming a second electrode on the first surface;
   forming an insulating layer on first surface sides of the semiconductor layers and on side surfaces of the semiconductor layers, each of the side surfaces continued from the second surface, the insulating layer covering the first electrode, the second electrode, and the side surfaces of the semiconductor layers;
   forming a first opening and a second opening in the insulating layer, the first opening reaching the first electrode, the second opening reaching the second electrode;
   forming a first interconnect layer in the first opening of the insulating layer and on a surface of the insulating layer on a side opposite to the semiconductor layer;
   forming a second interconnect layer in the second opening of the insulating layer and on the surface of the insulating layer on the side opposite to the semiconductor layer, a portion of the second interconnect layer overlapping on the light emitting layer via the insulating layer;
   forming a first metal pillar on a surface of the first interconnect layer on a side opposite to the first electrode;
   forming a second metal pillar on a surface of the second interconnect layer on a side opposite to the second electrode;
   forming a resin layer between a side face of the first metal pillar and a side face of the second metal pillar;
   removing the substrate after forming the resin layer;
   dicing the insulating layer and the resin layer at a position of the separating trench to divide a light emitting chip into a plurality of light emitting chips, each of the light emitting chips including the semiconductor layer, the first electrode, the second electrode, the insulating layer, the first interconnect layer, the second interconnect layer, the first metal pillar, the second metal pillar, and the resin layer;
   placing the light emitting chips on a support at a second pitch with the second surface facing the support, the second pitch being larger than a first pitch on the substrate;
   forming a fluorescent material layer on a plurality of second surfaces of the semiconductor layers, and covering the side surfaces of the semiconductor layers via the insulating layer with a portion of the fluorescent material layer; and
   dicing a portion of the fluorescent material layer between the light emitting chips.

2. The method of claim 1, wherein the fluorescent material layer has a transparent resin and a fluorescent material dispersed in the transparent resin.

3. The method of claim 1, wherein the fluorescent material layer covers the entire second surface.

4. The method of claim 1, wherein a dicing width of a trench formed by dicing the fluorescent material layer is smaller than the second pitch of the plurality of light emitting chips.

5. The method of claim 1, wherein the portion of the fluorescent material layer is diced without dicing the support on which the plurality of light emitting chips are placed.

6. The method of claim 1, wherein the placing of the light emitting chips on the support includes:
   attaching the light emitting chips placed at the first pitch to a stretchable tape;
   stretching the tape to widen a pitch between the light emitting chips from the first pitch to the second pitch; and
   forming the fluorescent material layer on the second surfaces of the light emitting chips placed at the second pitch so as to be connected between the light emitting chips.

7. The method of claim 6, wherein the fluorescent material layer in a film form is attached to the light emitting chips placed at the second pitch.

8. The method of claim 7, wherein the forming of the fluorescent material layer includes:
   attaching a first fluorescent material layer in a film form onto the second surfaces; and
   forming a second fluorescent material layer on the first fluorescent material layer, the second fluorescent material layer having a fluorescence peak wavelength different from a fluorescence peak wavelength of the first fluorescent material layer.

9. The method of claim 8, further comprising:
   forming a recessed portion in a portion of the first fluorescent material layer between the light emitting chips,
   the second fluorescent material layer being formed on the first fluorescent material layer so as to be filled into the recessed portion.

10. The method of claim 1, wherein the fluorescent material layer is not formed between the first metal pillar and the second metal pillar.

* * * * *